(12) United States Patent
Kang et al.

(10) Patent No.: US 8,115,324 B2
(45) Date of Patent: Feb. 14, 2012

(54) SEMICONDUCTOR MODULE

(75) Inventors: Sun-Won Kang, Seoul (KR);
Young-Hee Song, Seongnam-si (KR);
Tae-Gyeong Chung, Suwon-si (KR);
Nam-Seog Kim, Yongin-si (KR);
Seung-Duk Baek, Hwaseong-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 606 days.

(21) Appl. No.: 12/292,196

(22) Filed: Nov. 13, 2008

(65) Prior Publication Data

US 2009/0127717 A1   May 21, 2009

(30) Foreign Application Priority Data

Nov. 15, 2007  (KR) .................. 10-2007-0116811

(51) Int. Cl.
*H01L 29/40* (2006.01)
(52) U.S. Cl. .................. 257/784; 257/684; 257/777
(58) Field of Classification Search .................. 257/686, 257/784, 777
See application file for complete search history.

(56) References Cited

U.S. PATENT DOCUMENTS

| 2006/0076690 A1 | 4/2006 | Khandros et al. |
| 2006/0091518 A1 | 5/2006 | Grafe et al. |
| 2006/0166404 A1 | 7/2006 | Corisis et al. |

FOREIGN PATENT DOCUMENTS

KR    10-0459730    11/2004

*Primary Examiner* — Samuel Gebremariam
(74) *Attorney, Agent, or Firm* — Harness, Dickey & Pierce (57) ABSTRACT

A semiconductor module may include a circuit substrate with a first die on the circuit substrate and a second die on the first die. The first die may include at least one first data input/output pad on a first peripheral portion of the first die and at least one first control/address pad on a third peripheral portion, the third peripheral portion being separate from the first peripheral portion of the first die. The second die may include at least one second data input/output pad on a second peripheral portion and at least one second control/address pad on a fourth peripheral portion. The second peripheral portion of the second die is not overlapped with the first peripheral portion of the first die in plan view. The fourth peripheral portion of the second die overlaps at least a portion of the third peripheral portion of the first die.

20 Claims, 6 Drawing Sheets

SEMICONDUCTOR MODULE

PRIORITY STATEMENT

This application claims priority under 35 U.S.C. §119 to Korean Patent Application No. 2007-116811, filed on Nov. 15, 2007, in the Korean Intellectual Property Office (KIPO), the entire contents of which are herein incorporated by reference.

BACKGROUND

1. Field

Example embodiments relate to a semiconductor module. More particularly, example embodiments relate to a semiconductor module having a plurality of semiconductor dies vertically stacked on a circuit substrate.

2. Description of the Related Art

Generally, a semiconductor device is manufactured through fabrication processes for forming a circuit on a semiconductor substrate such as a silicon wafer, electrical die sorting (EDS) processes for inspecting electrical characteristics of the circuit formed on the substrate, and packaging processes for sealing the semiconductor device using epoxy resin.

Recently, the demand for small sized electrical parts has increased. Accordingly, semiconductor modules with improved degrees of integration are desired.

Figure 1:
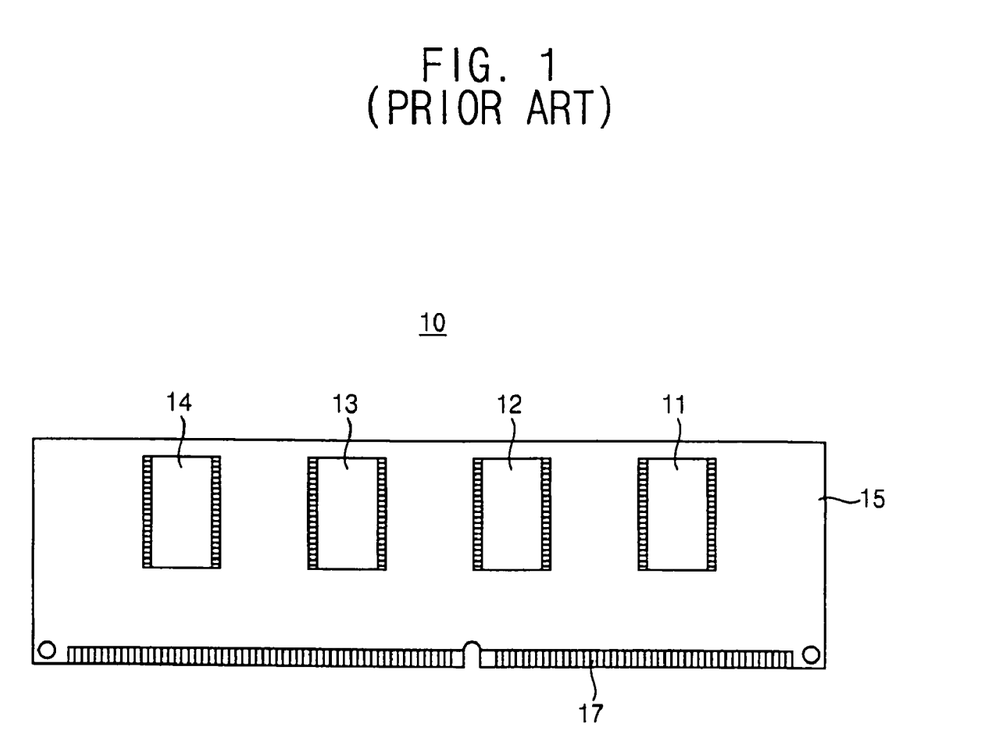
FIG. 1 is a plan view illustrating a conventional semiconductor module.

FIG. 1 is a cross section view illustrating a conventional semiconductor module. Referring to FIG. 1, a conventional semiconductor module 10 includes a circuit substrate 15 and a plurality of semiconductor chips 11, 12, 13, and 14. The semiconductor module 10 is mounted on a main board (not shown) having a connection socket. The semiconductor module is generally mounted in the connection socket by a slot configuration.

The circuit substrate 15 includes a plurality of connection terminals 17 to connect the semiconductor chips 11, 12, 13 and 14 to the main board. The connection terminals 17 are formed on a peripheral portion of the circuit substrate 15 along one side of the circuit substrate 15. The connection terminals 17 are inserted into the connection socket formed on the main board. Since the semiconductor module 10 includes the semiconductor chips 11, 12, 13, and 14, many connection terminals 17 are required. Thus, in order to secure an area of the circuit substrate 15 for forming the connection terminals 17, a length of the circuit substrate 15 may increase. As a result, it may be difficult to mount the semiconductor module 10 on the main board. Further, when the circuit substrate 15 is inserted into the connection socket in the slot configuration, a mounting height measured from the main board to a top position of the semiconductor module may increase. Thus, when the semiconductor module is required to be used with an electric part having a relatively thin thickness, for example, a cellular phone, the semiconductor module may not be easily fitted to the electric part.

SUMMARY

Example embodiments provide a semiconductor module having a relatively small size.

In accordance with at least one example embodiment, a semiconductor module may include a circuit substrate, a first die on the circuit substrate, and a second die on the first die. The semiconductor module may further include at least one first data input/output pad on the first die formed at a first peripheral portion of the first die, the at least one first data input/output pad being configured to input/output a first data input/output signal into/from the circuit substrate. The semiconductor module may also include at least one second data input/output pad on the second die formed at a second peripheral portion of the second die, the at least one second data input/output pad being configured to input/output a second data input/output signal into/from the circuit substrate, wherein the second peripheral portion does not overlap the first peripheral portion. The semiconductor module may also include at least one first control/address pad on the first die formed at a third peripheral portion of the first die, the first control/address pad configured to input/output a control/address signal into/from the circuit substrate, wherein the third peripheral portion is separate from the first peripheral portion. The semiconductor module may also include at least one second control/address pad on the second die formed at a fourth peripheral portion of the second die, the second control/address pad configured to input/output a control/address signal into/from the circuit substrate, wherein the fourth peripheral portion overlaps at least a portion of the third peripheral portion.

BRIEF DESCRIPTION OF THE DRAWINGS

Example embodiments will be more clearly understood from the following detailed description taken in conjunction with the accompanying drawings. FIGS. 2A to 6B represent non-limiting, example embodiments as described herein.

DETAILED DESCRIPTION OF THE EMBODIMENTS

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2A:
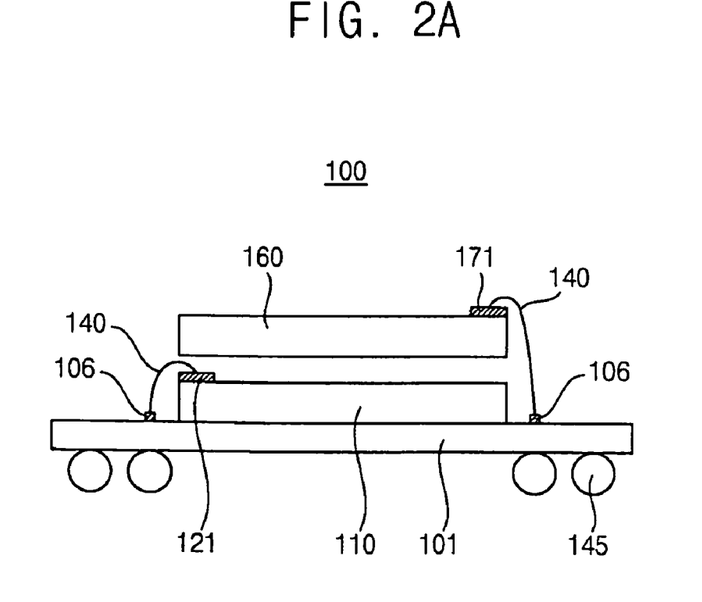
FIG. 2A is a front view illustrating a semiconductor module in accordance with some example embodiments.
Figure 2B:
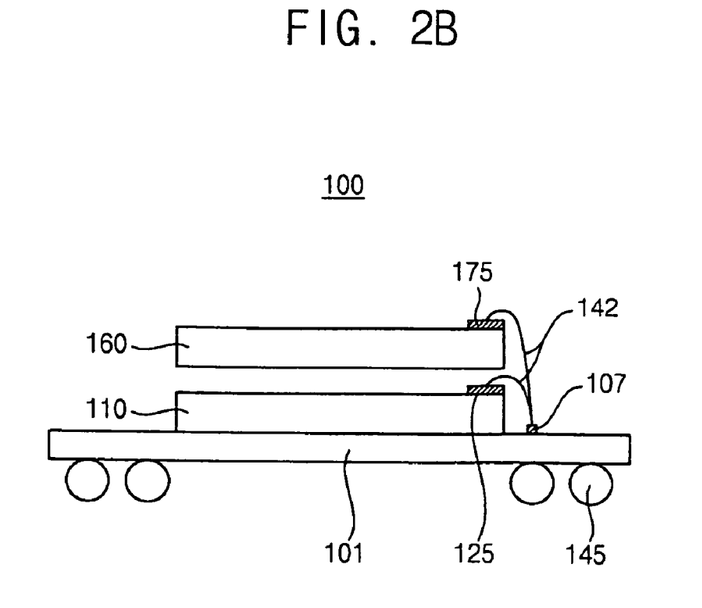
FIG. 2B is a side view illustrating the semiconductor module in FIG. 2A.
Figure 3A:
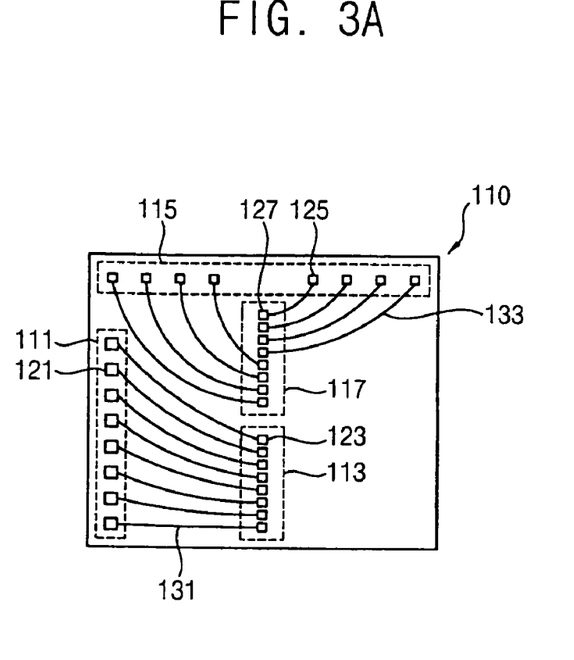
FIGS. 3A and 3B are plan views illustrating the first die and the second die in FIG. 2A, respectively.
Figure 3B:
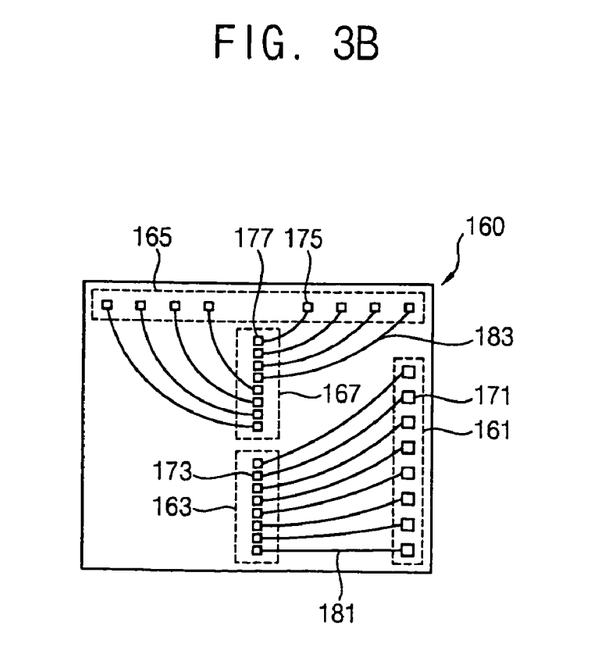

FIG. 2A is a front view illustrating a semiconductor module in accordance with some example embodiments. FIG. 2B is a side view illustrating the semiconductor module in FIG. 2A. FIGS. 3A and 3B are plan views illustrating the first die and the second die in FIG. 2A, respectively. Referring to FIGS. 2A and 2B, the semiconductor module 100 includes a circuit substrate 101, a first die 110 and a second die 160.

The circuit substrate 101 may include a semiconductor substrate. For example, the circuit substrate 101 may include a synthetic resin substrate having a relatively thin thickness. In some embodiments, the circuit substrate 101 has a rectangular parallelepiped shape. In other words, the circuit substrate 101 may have a rectangular plate shape. The circuit substrate 101 having the rectangular parallelepiped shape includes a first face and a second face opposite to the first face. The first and the second dies 110 and 160 are disposed on the first face of the circuit substrate 101.

In some example embodiments, the circuit substrate 101 includes at least one connection pad, which inputs/outputs an electrical signal into/from the circuit substrate 101. In some example embodiments, a plurality of connection pads are formed on the circuit substrate 101. The connection pads may be formed on a peripheral portion of the circuit substrate 101 so that the connection pads do not overlap with the first die 110 and the second die 160.

The connection pads include first connection pads 106 transmitting data input/output signals and at least one second connection pad 107 transmitting a control/address signal. The control/address signal may include signals commonly applied to the first and the second dies 110 and 160. For example, the control/address signal may include a command signal and an address signal. The first connection pads 106 may be connected to at least one first data input/output pad 121 and at least one second data input/output pad 171, which are formed on the first and the second dies 110 and 160, respectively, by a wire bonding using first wires 140. Further, the at least one second connection pad 107 may be commonly and serially connected to at least one first control/address pad 125 formed on the first die 110 and at least one second control/address pad 175 formed on the second die 160 by a wire bonding using second wires 142.

For example, when the number of dies disposed on the circuit substrate 101 is M (M is an integer greater than or equal to 2) and the number of data input/output pads formed on each of the first and the second dies 110 and 160 is N (N is an integer greater than or equal to 2), the number of the first connection pads 106 formed on the circuit substrate 101 is M×N. Further, when the number of dies disposed on the circuit substrate 101 is M (M is an integer greater than or equal to 2) and the number of control/address pads formed on each of the dies is L (L is an integer greater than or equal to 2), the number of the second connection pads formed on the circuit substrate 101 is L.

In some example embodiments, the semiconductor module 100 may further include a connection member 145 formed on the peripheral portion of the circuit substrate 101. The connection member 145 may be mounted on a slot portion of the main board, which may have a slot receiving the connection member 145.

In other example embodiments as shown in FIGS. 2A and 2B, the connection member 145 is formed on the second face of the circuit substrate 101. The connection member 145, for example, includes a solder ball, a metal pin, a metal land, etc.

The circuit substrate 101 may be electrically connected to a main board (not shown), on which the circuit substrate 101 may be mounted, via the connection member 145. The circuit substrate 101 inputs/outputs an electrical signal into/from the main board. In accordance with other example embodiments, a mounting height, measured from an upper face of the main board to a top position of the semiconductor module 100, may decrease, when compared with the circuit substrate 101 mounted on the slot portion of the main board. Thus, the semiconductor module 100 in accordance with other example embodiments may be easily adapted to an electrical part required to have a relatively thin thickness.

Referring to FIG. 3A, the first die 110 is mounted on the first face of the circuit substrate 101. The first die 110 includes at least one first data input/output pad 121 formed on a first peripheral portion 111 of the first die 110. The first peripheral portion 111 may be formed on a face of the first die 110 facing away from the substrate 101. In addition, as shown in FIG. 3A, the first peripheral portion 111 may be located near an edge or side of the first die 110. The first die 110 inputs/outputs a first data input/output signal into/from the circuit substrate 101 via the first data input/output pad 121.

As shown in FIG. 3A, the at least one first data input/output pad 121 may be a plurality of first data input/output pads 121 arranged on the first peripheral portion 111 in a first row. When the first die 110 has a rectangular plate shape, the first data input/output pads 121 may be arranged in the first row along a first side of the first die 110.

In some example embodiments, the first die 110 further includes at least one first control/address pad 125 arranged on a third peripheral portion 115 of the first die 110. The at least one control/address pad 125 may be configured to receive a common signal commonly applied to the second die 160 from the circuit substrate 101 or configured to input the common signal into the circuit substrate 101. For example, the common signal may include a control/address signal. The first die 110 and the second die 160 do not individually receive the control/address signal from the circuit substrate 101, rather, the first die 110 and the second die 160 commonly receive the control/address signal from the circuit substrate 101

As shown in FIG. 3A, the at least one first control/address pad 125 may be a plurality of first control/address pads 125 formed on the third peripheral portion 115 of the first die 110. The third peripheral portion 115 may be formed on a face of the first die 110 facing away from the substrate 101. Accordingly, the first and third peripheral portions 111 and 115 may be located on the same face of the first die 110, however, the third peripheral portion 115 and the first peripheral portion 111 do not overlap. For example, when the first die 110 has a rectangular plate shape and the plurality of first data input/output pads 121 are formed on the first peripheral portion 111 along the first row (i.e. along a first side of the first die 110), a plurality of first control/address pads 125 may be arranged on the third peripheral portion 115 in a first row along a second side of the first die 110. The second side of the first die 110 may be substantially perpendicular to the first side of the first die 110. Alternatively, the plurality of first control/address pads 125 may be arranged along a third side of the first die. The third side may be substantially parallel to the first side of the first die 110.

In some example embodiments, the first die 110 further includes at least one first central pad 123 formed on a first central portion 113 of the first die 110 and at least one first redistributing line 131 to electrically connect the at least one first central pad 123 to a first data input/output pad 121. The first central portion 113 is formed on a face of the first die 110 facing away from the substrate 101. Accordingly, the first central portion 113, the first peripheral portion 111, and the third peripheral portion 115 may be formed on the same face of the die 110, however, the first central portion 113, the first peripheral portion 111, and the third peripheral portion 115 do not overlap. For example, as shown in FIG. 3A, the first central portion 113, may be located near middle of the first die 110, the first peripheral portion 111 may be located near a first side of the first die 110, and the third peripheral portion 115 may be located at a second side of the first die 110 which may be substantially perpendicular to the first side of the die 110.

The first central pad 123 may output data input/output signals from a memory cell (not shown) formed in the first die 110 or input data input/output signals from an external source. As shown in FIG. 3A, the at least one first central pad 123 may be plurality of first central pads 123 formed on—the first die 110 to input a plurality of data input/output signals into the memory cell or deliver the data input/out signals from the memory cell to the external device.

The first redistributing line 131 is formed between a first central pad 123 and a first data input/output pad 121. When a plurality of the first central pads 123 and a plurality of the first data input/output pads 121 are formed, a plurality of first redistributing lines 131 may be formed to connect the first central pads 123 to the first data input/output pads 121, respectively, so that the number of first redistributing lines 131 corresponds to the number of the first central pads 123 identical to that of the first data input/output pads 121. Thus, the first central pads 123 formed on the first central portion 113 may be electrically connected to the first data input/output pads 121 through the first redistributing lines 131.

In some example embodiments, the first die 110 further includes at least one third central pad 127 and at least one third redistributing line 133 electrically connecting the third central pad 127 to a first control/address pad 125. The third central pad 127 is formed on a third central portion 117 adjacent to the first central portion 113. For example, the third central portion 117 may extend from the center of the first die 110 to be substantially parallel to the first peripheral portion 111.

The third central portion 117 may be formed on a face of the first die 101 facing away from the substrate 101, accordingly, the first peripheral portion 111, the first central portion 113, the third peripheral portion 115 and the third central portion 117 may be formed on the same face of the first die 110, however, the first peripheral portion 111, the first central portion 113, the third peripheral portion 115 and the third central portion 117 may be formed on the same face of the first die 110 do not overlap. For example, as shown in FIG. 3A, the first central portion 113 and the third central portion 117 may be located near middle of the first die 110, the first peripheral portion 111 may be located near a first side of the first die 110, and the third peripheral portion 115 may be located at a second side of the first die 110 which may be perpendicular to the first side of the die 110.

The third central pad 127 may be configured to output a control/address signal from the memory cell formed in the first die 110 or deliver a control/address signal from an external device to the memory cell. As shown in FIG. 3A, the at least one third central pad 123 may be a plurality of third central pads 123 to input a plurality of control/address signals to the memory cell or deliver the control/address signals from the memory cell to an external device. For example, as shown in FIG. 3A, a plurality of first central pads 123 and a plurality of third central pads 127 may be arranged in one row. However, example embodiments are not limited thereto, for example, a plurality of first central pads 123 and a plurality of third central pads 127 may be arranged in two rows. In short, a plurality of first central pads 123 and a plurality of third central pads 127 may be arranged in various manners.

The third redistributing line 133 may be formed between a third central pad 127 and a first control/address pad 125. When a plurality of the third central pads 127 and a plurality of the first control/address pads 125 are formed, a plurality of third redistributing lines 133 may be formed to connect the third central pads 127 to the first control/address pads 125, respectively, so that the number of third redistributing lines 133 corresponds to the number of the third central pads 127 identical to that of the first control/address pads 125. Thus, the third central pads 127 formed on the third central portion 117 may be electrically connected to the first control/address pads 125 through the third redistributing lines 133.

Referring to FIG. 3B, the second die 160 is stacked on the first die 110. The second die 160 includes at least one second data input/output pad 171. The second data input/output pad 171 is formed on a second peripheral portion 161 of the second die 160. The second peripheral portion 161 may be formed on a face of the second die 160 facing away from the substrate 101. In addition, as shown in FIG. 3B, the second peripheral portion 161 may be located near an edge or side of the second die 160. The second peripheral portion 161 is non-overlapped with the first peripheral portion 111 of the first die 110, on which the first data input/output pad 121 is formed.

The second die 160 may be configured to input/output a second data input/output signal into/from the circuit substrate 101 through the second data input/output pad 171. The second data input/output signal, inputted into the second die 160 or outputted from the second die 160, may be independent of the first data input/output signal, inputted to the first die 110 or outputted from the first die 110. The second die 160 may output a second data input/output signal into the circuit substrate 101 or receive the second data input/output signal from the circuit substrate 101 through the second data input/output pad 171.

As shown in FIG. 3B, the at least one second data input/output pad 171 may be a plurality of second data input/output pads 171 arranged in a second row on the second peripheral portion 161. When the second die 160 has a rectangular plate shape, the plurality of second data input/output pads 171 may be arranged in the second row along a first side of the second die 160. When viewed in plan, the first die 110 may include a plurality of first data input/output pads 121 arranged in the first row and the die 160 may include a plurality of second data input/output pads 161 arranged in a second row opposite to the first row.

When the first connection pads 106 on the circuit substrate 101 are electrically connected to a plurality of first and plurality of second data input/output pads 121 and 171, respectively, the number of the first connection pads 106 corresponds to the total number of the first and the second data input/output pads 121 and 171. Further, the first connection pads 106 are disposed on a portion of the circuit substrate 101, adjacent to the non-overlapped first peripheral portion 111 and the second peripheral portion 161. Thus, the portion of the circuit substrate 101 for forming the first connection pads has an increased area. As a result, when a plurality of dies stack on the circuit substrate 101 and a relatively large number of the first connection pads 106 is in demand, the circuit substrate 101 may have an enlarged area for forming the first connection pads.

In some example embodiments, the second die 160 further includes at least one second control/address pad 175 configured to receive a common signal commonly applied to the second die 160 from the circuit substrate 101 or configured to input the common signal into the circuit substrate 101. For example, the common signal includes a control/address signal. The first die 110 and the second die 160 do not individually transmit the control/address signal with the circuit substrate 101, rather, the first die 110 and the second die 160 commonly transmit the control/address signal with the circuit substrate 101.

The second control/address pad 175 may be formed on a fourth peripheral portion 165 of the second die 160, which is overlapped with the third peripheral portion 115 of the first die 110 in plan view. The fourth peripheral portion 165 may be formed on a face of the second die 160 facing away from the substrate 101. Accordingly, the second peripheral portion 161 and the fourth peripheral portion 165 may be on the same face of the second die 160. As shown in FIG. 3B, the at least one second control/address pad 175 may be a plurality of the second control/address pads 175 formed on fourth peripheral portion 165 of the second die 160. When the first and the second dies 110 and 160 have rectangular plate shapes and the first control/address pads 125 are formed along the second side of the first die 110, the second control/address pads 175 are arranged along a second side of the second die 160, which is overlapped with the second side of the first die 110 in plan view.

The second connection pad 107 transmitting the control/address signal may be disposed adjacent to the first and the second control/address pads 125 and 175. Each of the first and the second control/address pads 125 and 175 may be electrically and serially connected to the second connection pad 107 by wire bondings. Thus, when compared with the first and the second control/address pads 125 and 175 parallelly connected to the second connection pad 107, the semiconductor module 100 may have improved electrical characteristics. In other words, each of the first and the second control/address pads 125 and 175 is electrically and serially connected to the second connection pad 107 so that the control/address signal is relatively rapidly transmitted to the first and the second dies 110 and 160. Each of the first and the second dies 110 and 160 may have a uniform signal delaying time, which may occur in each of the first and the second dies 110 and 160 while transmitting the control/address signal, therefore a signal reflection phenomenon may be alleviated. As a result, the semiconductor module 100 may have improved the electrical characteristics.

In some example embodiments, the second die 160 further includes at least one second central pad 173 formed on a second central portion 163 of the second die 160 and at least one second redistributing line 181. The second central portion 163 may be formed on a surface of the second die 160 facing away from the circuit substrate 101. The second redistributing line 181 may be configured to electrically connect a second central pad 173 to a second data input/output pad 171.

The at least one second central pad 173 may be configured to output the data input/output signal from the memory cell formed in the second die 160 and/or may be configured to input the data input/output signal to an external source. In some example embodiments, the at least one second central pad 173 is a plurality of second central pads 173 formed on the second central portion 163 of the second die 160 to input a plurality of data input/output signals into the memory cell or deliver the data input/output signals from the memory cell to the external device.

The second redistributing line 181 may be formed between a second central pad 173 and a second data input/output pad 171. When a plurality of the second central pads 173 and a plurality of the second data input/output pads 171 are formed on the second die 160, a plurality of second redistributing lines 181 may be formed to connect the second central pads to the second data input/output pads, respectively, so that the number of second redistributing lines 181 corresponds to the number of the second central pads 173 identical to that of the second data input/output pads 171. Thus, the second central pads 173 formed on the second central portion 163 may be electrically connected to the second data input/output pads 171 through the second redistributing lines 181, respectively.

In some example embodiments, the second die 160 may further include at least one fourth central pad 177 and at least one fourth redistributing line 183 electrically connecting the at least one fourth central pad 177 to a second control/address pad 175. The fourth central pad 177 may be formed on a fourth central portion 167 adjacent to the second central portion 163 on a face of the second die 160 facing away from the circuit substrate 101.

The at least one fourth central pad 177 may be configured to output control/address signals from the memory cell formed in the second die 160 and/or is configured to deliver the control/address signal from an external device to the memory cell. In some example embodiments, the at least one fourth central pad 177 is a plurality of fourth central pads 177 formed on the fourth central portion 167 of the second die 160 to input a plurality of control/address signals to the memory cell or deliver the control/address signals from the memory cell to the external device. For example, FIG. 3B illustrates a plurality of second central pads 173 and the fourth central pads 177 are arranged in one row near the middle of the second die 160 and parallel to the first side of the die 160. Alternatively, the second central pads 173 and the fourth central pads 177 may be arranged in two rows. In short, the second central pads 173 and the fourth central pads 177 may be arranged in various manners.

At least one fourth redistributing line 183 may be formed between a fourth central pad 177 and a second control/address pad 175. When a plurality of the fourth central pads 177 and a plurality of the second control/address pads 175 are formed, a plurality of fourth redistributing lines 183 is formed to connect the fourth central pads 177 to the second control/address pads 175, respectively, so that the number of fourth redistributing lines 183 corresponds to the number of the fourth central pads 177 identical to that of the second control/address pads 175. Thus, the fourth central pads 177 formed on the fourth central portion 163 may be electrically connected to the second control/address pads 175 through the fourth redistributing lines 183.

In some example embodiments, the semiconductor module 100 may further include a sealing member (not shown) surrounding the first and the second dies 110 and 160. The sealing member may electrically isolate the first and the second dies 110 and 160 and may protect the first and the second dies 110 and 160 from an external shock. The sealing member may include an insulation material having electrically-isolating characteristics. For example, the insulating material includes epoxy molding compound.

In some example embodiments, the semiconductor module 100 may further include an adhering member (not shown) interposed between the first and the second dies 110 and 160. The adhering member may include an electrically isolating material. The adhering member may attach the first and the second dies 110 and 160 to each other.

In some example embodiments, the semiconductor module 100 may include a plurality of dies vertically stacked on the circuit substrate 101 and at least one sealing member surrounding the dies.

In some example embodiments, the semiconductor module 100 may further include an electrical device (not shown). The electrical device may be disposed on the circuit substrate 101. Alternatively, the electrical device may be disposed on the second die 160. For example, the electrical device may include a passive device such as a resistor, a capacitor, a register, etc. In other example embodiments, the electrical device may include a non-volatile memory device such as an electrically erasable and programmable read only memory. Further, the electrical device may include an advanced memory buffer (AMB) chip. The AMB chip may receive a package of the command/address signal and date input/output signal and provide the package to each of the dies or may pack data signal outputted from each of the dies. The electrical device may include a serial presence detect (SPD) chip. The SPD chip stores information on a bios setup value required to mount a memory chip and drive the memory chip.

Figure 4:
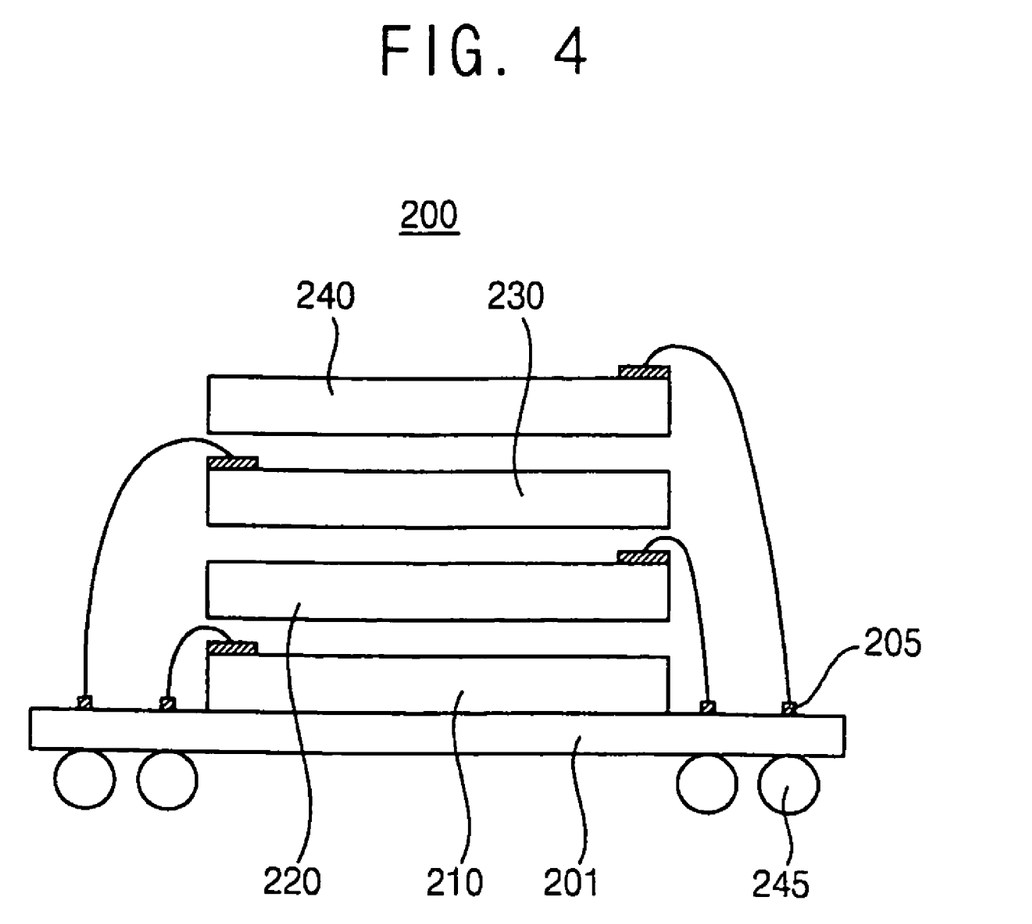
FIG. 4 is a front view illustrating a semiconductor module in accordance with some example embodiments.

FIG. 4 is a front view illustrating a semiconductor module in accordance with some example embodiments. The semiconductor module in FIG. 4 includes elements substantially the same as those of the semiconductor module illustrated with reference to FIGS. 2A to 3B except for the number of dies stacked on the circuit substrate. Thus, any further detailed description of the semiconductor module except for the number of dies will be omitted in order to avoid redundancy.

Referring to FIG. 4, a semiconductor module 200 includes a circuit substrate 201 and a first to a fourth dies 210, 220, 230 and 240, and connection pads 205. Also illustrated in FIG. 4 is an external connector 245 which may be similar to connection member 145 illustrated in FIGS. 2A and 2B.

The third die 230 may include a wiring pattern substantially identical to that in the first die 210 and the fourth die 240 include a wiring pattern substantially identical to that in the second die 220. That is, a first pair of a die group may include the first and the second dies 210 and 220 and a second pair of the die group may include the third and the fourth die 230 and 240.

In some example embodiments, the first through fourth dies 210, 220, 230 and 240 are stacked on the circuit substrate 201. In other example embodiments, a plurality of dies totaling more than four dies may be stacked on the circuit substrate 201.

Figure 5A:
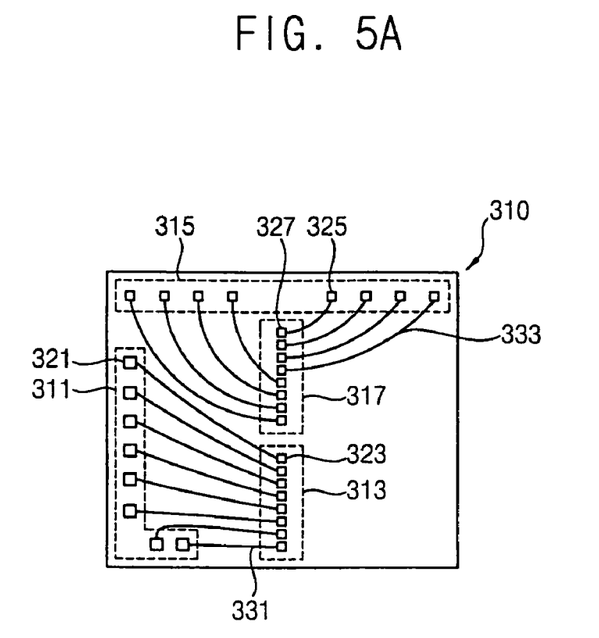
FIGS. 5A and 5B are plan views illustrating a first die and a second die in accordance with some example embodiments.
Figure 5B:
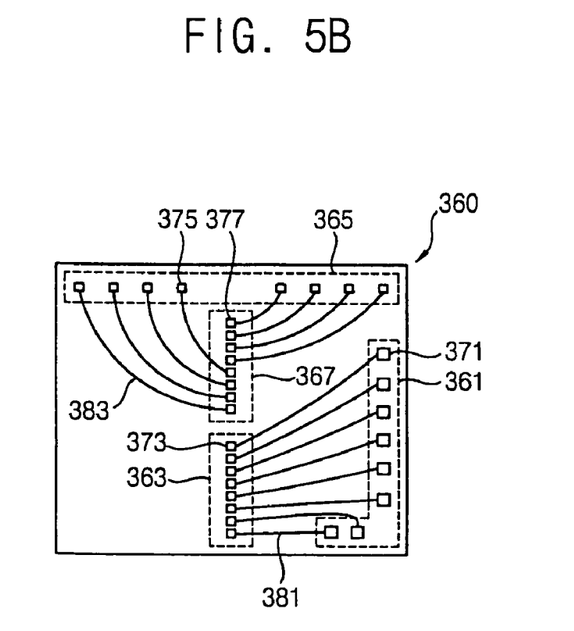

FIGS. 5A and 5B are plan views illustrating a first die and a second die in accordance with some example embodiments. The semiconductor module in FIGS. 5A and 5B includes elements substantially the same as those of the semiconductor module illustrated with reference to FIGS. 3A and 3B except for an arrangement of a first data input/output pad and a second data input/output pad. For example, FIG. 5 includes a control/address pad 325, a control pad 327, a peripheral portion 315, central portions 317 and 313, central pad 323 and redistributing lines 331 and 333 similar to the first control/address pad 125, the third control pad 127, the third peripheral portion 115, the third and first central portions 117 and 113, the first central pad 123, and the first and third redistributing lines 131 and 133 illustrated in FIG. 3A, respectively. Likewise, FIG. 5B includes a peripheral portion 365, a control/address pad 375, central pads 377 and 373, central portions 367 and 363, and redistributing lines 381 and 383 similar to the fourth peripheral portion 165, the second control/address pad 175, fourth and second central pads 177 and 173, fourth and second central portions 167 and 163, and second and fourth redistributing lines 181 and 183 illustrated in FIG. 3B, respectively. Thus, any further detailed description of the semiconductor module except for the first and the second data input/output pads will be omitted in order to avoid redundancy.

Referring to FIGS. 5A and 5B, a semiconductor module includes a circuit substrate, a first die 310 and a second die 360.

The first die 310 includes a first data input/output pad 321 disposed on a first peripheral portion 311 of the first die 310. When the first die 310 has a rectangular plate shape and a plurality of first data input/output pads is formed 321, the first data input/output pads 321 are formed along an edge of the first die 310. For example, the first data input/output pads 321 may be arranged on the first die 310 with an "L" array shape. Although the "L" array shape illustrated in FIG. 5A has one leg longer than the other, example embodiments are not limited thereto. For example, the lengths of each leg of the "L" shaped array may be the same.

The second die 360 includes a second data input/output pad 371 on a second peripheral portion 361 of the second die 360, which is non-overlapped with the first peripheral portion 311 in plan view of the circuit substrate. When the second die 360 has a rectangular plate shape and a plurality of second data input/output pads 371 is formed, the second data input/output pads 371 may be formed along an edge of the second die 360. For example, the second data input/output pads may be arranged on the second die 371 with an "L" array shape. Further, the array shape of the second data input/output pads is opposite to that of the first data input/output pads when the circuit substrate is viewed in plan. Although the "L" array shape illustrated in FIG. 5B has one leg longer than the other, example embodiments are not limited thereto. For example, the lengths of each leg of the "L" shaped array may be the same.

Figure 6A:
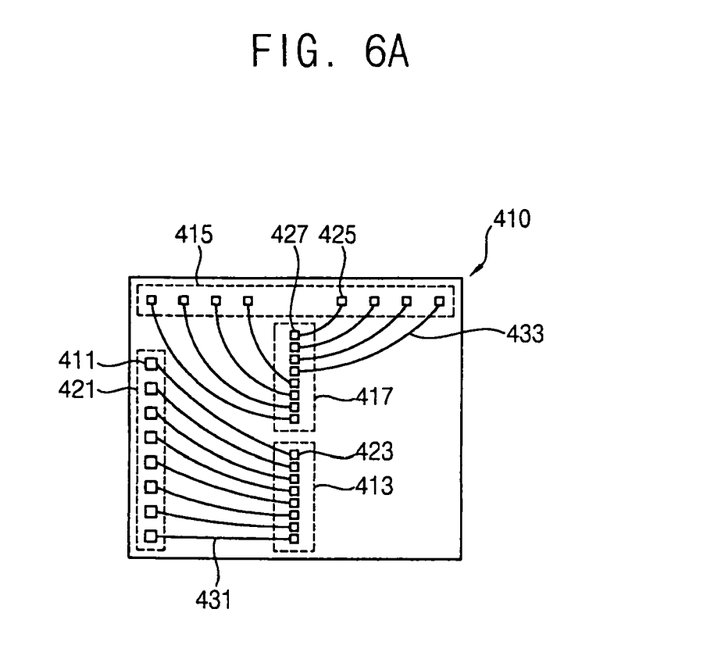
FIGS. 6A and 6B are plan views illustrating a first die and a second die in accordance with other example embodiments.
Figure 6B:
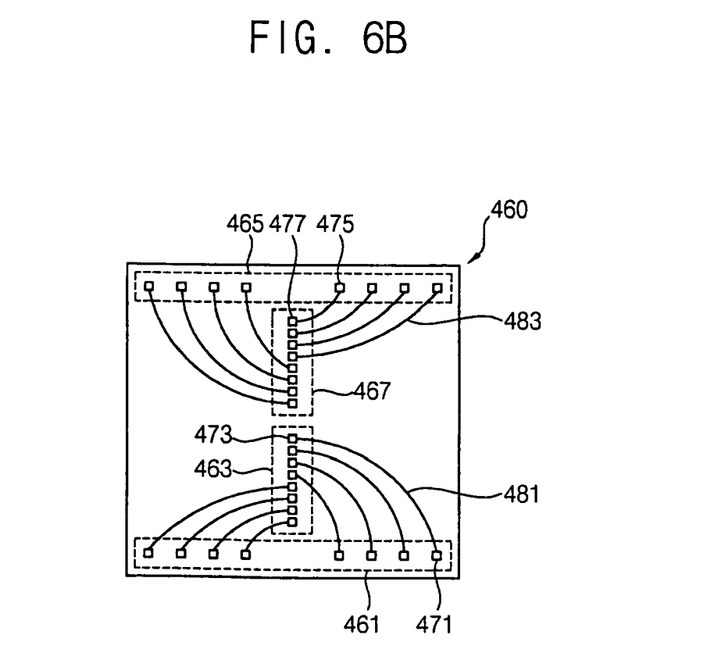

FIGS. 6A and 6B are plan views illustrating a first die and a second die in accordance with other example embodiments. The semiconductor module in FIGS. 6A and 6B includes elements substantially the same as those of the semiconductor module illustrated with reference to FIGS. 3A and 3B except for an arrangement of a first data input/output pads and a second data input/output pads. For example, FIG. 6A illustrates a central/address pad 425, a peripheral portion 415, central portions 413 and 417, central pads 423 and 427, and redistributing lines 431 and 433 similar to the first control/address pad 125, the third peripheral portion 115, the first and third central portions 113 and 117, the first and third central pads 123 and 127, and the first and third redistributing lines 131 and 133 illustrated in FIG. 3A, respectively. Likewise, FIG. 6B shows a control/address pad 475, a peripheral portion 465, central pads 473 and 477, central portions 463 and 467, and redistributing lines 481 and 483 similar to the second control/address pad 175, the fourth peripheral portion 165, the second and fourth central pads 173 and 177, the second and fourth central portions 163 and 167, and the redistributing lines 181 and 183 illustrated in FIG. 3B, respectively. Thus, any further detailed description of the semiconductor module except for the first and the second data input/output pads will be omitted in order to avoid redundancy.

Referring to FIGS. 6A and 6B, a semiconductor module includes a circuit substrate, a first die 410 and a second die 460.

The first die 410 includes a first data input/output pad 411 disposed on a first peripheral portion 421 of the first die 410. When the first die 410 has a rectangular plate shape and a plurality of first data input/output pads is formed, the first data input/output pads are formed along a side of the first die 410. For example, the first data input/output pads are arranged on the first die 410 in a first row.

The second die 460 includes a second data input/output pad 471 on a second peripheral portion 461 of the second die 460, which is non-overlapped with the first peripheral portion 421 in plan view of the circuit substrate. When the second die 460 has a rectangular plate shape and a plurality of second data input/output pads is formed, the second data input/output pads are formed along a side of the second die 460. For example, the second data input/output pads are arranged in a second row substantially perpendicular to the first row.

According to some example embodiments, when a central pad is redistributed into a data input/output pad, a first data input/output pad formed on a first die and a second data input/output pad formed on a second die are non-overlapped with each other. Thus, a portion of the circuit substrate for forming the first connection pads electrically connected to the first and the second data input/output pads has an increased area. As a result, when a semiconductor module includes a plurality of dies vertically stacked on the circuit substrate, the semiconductor module having a relatively small size may be realized. Further, a connection member formed on the second face of the circuit substrate 101 may electrically connect the circuit substrate to a main board. Thus, mounting height, measured from an upper face of the main board to an upper face of the semiconductor module may be lower when compared the circuit substrate mounted on the slot portion of the main board. Additionally, when a control/address signal is transmitted to each of dies. Each of the first and the second dies may have a uniform signal delaying time, which may occur to each of the dies while transmitting the control/address signal, because a signal reflection phenomenon may be alleviated. As a result, the semiconductor module 100 may have improved the electrical characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor module comprising:
    a circuit substrate;
    a first die on the circuit substrate;
    a second die on the first die;
    at least one first data input/output pad on the first die formed at a first peripheral portion of the first die, the at least one first data input/output pad configured to input/output a first data input/output signal into/from the circuit substrate;
    at least one second data input/output pad on the second die formed at a second peripheral portion of the second die, the at least one second data input/output pad configured to input/output a second data input/output signal into/from the circuit substrate, the second peripheral portion not overlapping the first peripheral portion;
    at least one first control/address pad on the first die formed at a third peripheral portion of the first die, the first control/address pad configured to input/output a control/ address signal into/from the circuit substrate, the third peripheral portion being separate from the first peripheral portion; and at least one second control/address pad on the second die formed at a fourth peripheral portion of the second die, the second control/address pad configured to input/output a control/address signal into/from the circuit substrate, the fourth peripheral portion overlapping at least a portion of the third peripheral portion.

2. The semiconductor module of claim 1, wherein the first die further includes at least one first central pad on a first central portion of the first die and at least one first redistributing line electrically connecting the at least one first central pad to the at least one first data input/output pad.

3. The semiconductor module of claim 1, wherein the second die further includes at least one second central pad formed on a second central portion of the second die and at least one second redistributing line electrically connecting the at least one second central pad to the at least one second data input/output pad.

4. The semiconductor module of claim 1, wherein the first die further includes at least one third central pad on a third central portion of the first die and at least one third redistributing line electrically connecting the at least one third central pad to the at least one first control/address pad.

5. The semiconductor module of claim 1, wherein the second die further includes at least one fourth central pad on a fourth central portion of the second die and at least one fourth redistributing line electrically connecting the at least one fourth central pad to the at least one second control/address pad.

6. The semiconductor module of claim 1, further comprising:
a connection member configured to electrically connect the circuit substrate to an external device, the connection member including any one of a solder ball, a metal pin and a metal land.

7. The semiconductor module of claim 1, wherein the circuit substrate includes a plurality of first connection pads adjacent to the at least one first data input/output pad and the at least one second data input/output pad on a surface of the circuit substrate, the first connection pads configured to transmit the first and the second data input/output signals to the first and the second dies.

8. The semiconductor module of claim 7, further comprising:
at least two first wires, wherein one of the at least two first wires connects the at least one first data input/output pad to a first connection pad and the other of the at least two first wires connects the at least one second data input/output pad to another connection pad.

9. The semiconductor module of claim 1, wherein the circuit substrate includes at least one second connection pad on a surface of the circuit substrate adjacent to the at least one first control/address pad and the at least one second control/address pad, the second connection pad configured to commonly transmit first and the second control/address signals to the first and the second dies.

10. The semiconductor module of claim 9, further comprising:
at least one second wire electrically and serially connecting the at least one first control/address pad and the at least one second control/address pad to the at least one second connection pad.

11. The semiconductor module of claim 1, wherein the first and the second dies form a pair of a die group and the semiconductor module includes a plurality of pairs of the die group stacked on the circuit substrate.

12. The semiconductor module of claim 11, further comprising:
first connection pads formed on the circuit substrate configured to transmit data input/output signals to the first and the second dies, respectively, the number of the first connection pads being M×N when the number of the dies stacked on the circuit substrate is M, the number of the data input/output pads formed on each of the dies is N, and M and N are integers greater than or equal to two.

13. The semiconductor module of claim 1, further comprising:
an electric device on one of the circuit substrate or the second die.

14. The semiconductor module of claim 13, wherein the electric device includes one of a capacitor, a resistor, and a serial presence detect (SPD) chip.

15. The semiconductor module of claim 13, wherein the electric device includes a non-volatile memory device.

16. The semiconductor module of claim 13, wherein the electric device includes a register chip or an advanced memory buffer (AMB) chip.

17. The semiconductor module of claim 1, wherein
the at least one first data input/output pad is a plurality of first data input/output pads arranged in a first row, and
the at least one second data input/output pad is a plurality of second data input/output pads arranged in a second row.

18. The semiconductor module of claim 17, wherein each of the first and the second dies has a rectangular plate shape, and the first row is substantially perpendicular to the second row in plan view of the circuit substrate.

19. The semiconductor module of claim 17, wherein the first row is opposite to the second row in plan view of the circuit substrate.

20. The semiconductor module of claim 19, wherein the plurality of first data input/output pads are arranged in an "L" array shape and the plurality of second data input/output pads are arranged in an "L" array shape.

* * * * *